United States Patent [19]
Itoh

[11] Patent Number: 5,663,676
[45] Date of Patent: Sep. 2, 1997

[54] ACTIVE FILTER INDEPENDENTLY CONTROLLING CUT-OFF FREQUENCY AND QUALITY FACTOR

[75] Inventor: Hiroko Itoh, Yamagata, Japan

[73] Assignee: NEC Corporation, Tokyo, Japan

[21] Appl. No.: 603,259

[22] Filed: Feb. 20, 1996

[30] Foreign Application Priority Data

Feb. 21, 1995 [JP] Japan .................... 7-032485

[51] Int. Cl.[6] ............... H03H 11/12; H03K 5/00
[52] U.S. Cl. ............... 327/553; 327/552; 330/305
[58] Field of Search ................... 327/311, 552, 327/553, 555, 556, 557, 558, 559, 103, 560; 330/294, 305, 306

[56] References Cited

U.S. PATENT DOCUMENTS 5,117,205  5/1992  Nauta ........................ 327/553
5,396,188  3/1995  Aoki ........................ 327/552

FOREIGN PATENT DOCUMENTS 64-29111   1/1989  Japan .
1169704    7/1989  Japan .
2309710   12/1990  Japan .

Primary Examiner—Timothy P. Callahan
Assistant Examiner—Dinh T. Le
Attorney, Agent, or Firm—Whitham, Curtis, Whitham & McGinn

[57] ABSTRACT

A series of first and second operational amplifier circuits form a low-pass filter together with capacitors, and a current controlling circuit is responsive to a frequency control signal representative of a target cut-off frequency of the filter and a quality factor control signal representative of a target quality factor so as to respectively supply first and second controlling currents to the first and second operational amplifiers, thereby independently controlling the cut-off frequency and the quality factor with the frequency control signal and the quality factor control signal.

2 Claims, 4 Drawing Sheets

ACTIVE FILTER INDEPENDENTLY CONTROLLING CUT-OFF FREQUENCY AND QUALITY FACTOR

FIELD OF THE INVENTION

This invention relates to an active filter and, more particularly, to an active filter having a current controller for independently controlling cut-off frequency and quality factor.

DESCRIPTION OF THE RELATED ART

Typical examples of the active filter are disclosed in Japanese Patent Publication of Unexamined Application Nos. 2-309710 and 64-29111. Active elements such as operational amplifiers are incorporated therein, and current supplied to the operational amplifiers is varied so as to change the mutual conductance (gm), thereby regulating the cut-off frequency (fO) and the quality factor (Q).

FIG. 1 illustrates the active filter disclosed in Japanese Patent Publication of Unexamined Application No. 64-29111. The prior art active filter serves as a secondary low-pass filter, and comprises two operational amplifiers 1 and 2, two capacitors CP1 and CP2 and two current sources 3 and 4.

An input terminal T1 is connected to the non-inverting input node of the operational amplifier 1, and the output node of the operational amplifier 1 is connected to the non-inverting input node of the operational amplifier 2. An output terminal T2 is connected to the inverting input nodes of the operational amplifiers 1 and 2, and the capacitors CP1 and CP2 are connected between the output nodes of the operational amplifiers 1 and 2 and the ground. The capacitors CP1 and CP2 have respective capacitances Ca and Cb. The current sources 3 and 4 supply control currents i1 and i2 to the operational amplifiers 1 and 2.

The prior art active filter behaves as follows. The mutual conductances gm1 and gm2 of the operational amplifiers 1 and 2 are expressed by equations 1 and 2.

$$gm1 = i1 \times 1 \qquad 1$$

$$gm2 = i2 \times 2 \qquad 2$$

where X1 and X2 are constants determined by parameters of the internal circuits of the operational amplifiers 1 and 2 such as emitter resistances.

U, V and W are representative of the signals levels at the input terminal T1, the output node of the operational amplifier 1 and the output terminal T2.

We have $$S = jw \qquad 3$$

Then, relations among the signal levels U, V and W are expressed as $$(U-W)gm1 \; 1/SC1 = V \qquad 4$$

$$(V-W)gm2 \; 1/SC2 = W \qquad 5$$

The transfer function H(s)o is given as $$H(s)o = W/U \qquad 6$$
$$= (gm1 \; gm2/C1 \; C2)/(S^2 + Sgm2/C2 + gm1 \; gm2/C1 \; C2)$$

The transfer function H (s) of a low-pass filter is expressed by equation 7.

$$H(s) = w^2 o / \{S^2 + S(w/Q) + w^2 o\} \qquad 7$$

where wo is the angular frequency and Q is the quality factor.

We assume that each term of equation 6 has a coefficient equal to the coefficient of the corresponding term of equation 7. We obtain the following equations. wo = (gm1 gm2/C1C2)$^{1/2}$ Then, $$fo = 1/2pi(gm1 \; gm2/c1 \; c2)^{1/2} \qquad 8$$

$$Q = \{(C2 \; gm1)/(C1 \; gm2)\}^{1/2} \qquad 9$$

As will be understood from equations 8 and 9, when gm1 and gm2 are independently controlled by i1 and i2, fo is given as the produce of gm1 and gm2, and Q is controlled by using the ratio between gm1 and gm2.

For example, we assume that the control currents i1 and i2 are varied by $\Delta i1$ and $\Delta i2$. 1 and 2 give the mutual conductances gm1A and gm2A as follows.

$$gm1A = gm1(1 + \Delta i1/i1) \qquad 10$$

$$gm2A = gm2(1 + \Delta i2/i2) \qquad 11$$

From equations 8, 9, 10 and 11, the cut-off frequency foA and the quality factor QA are given by equations 12 and 13.

$$foA = fo\{1 + \Delta i1/i1)(1 + delta - i2/i2)\}^{1/2} \qquad 12$$

$$QA = Q\{(1 + \Delta i1/i1)/(1 + delta - i2/i2)\}^{1/2} \qquad 13$$

It is clear from equations 12 and 13 that $\Delta i1$ and $\Delta i2$ should be concurrently regulated without variation of ($\Delta i1/i1$) and (delta–i2/i2). On the other hand when Q is regulated without a change of fo, $\Delta i1$ and $\Delta i2$ are concurrently changed in such a manner as to change the ratio between the $\Delta i1$ and $\Delta i2$ without changing the product $(1 + \Delta i1/i1)(1 + \Delta i2/i2)$.

However, such a delicate regulating work is not easy, and is time-consuming.

SUMMARY OF THE INVENTION

It is therefore an important object of the present invention to provide an active filter which independently regulates the cut-off frequency and the quality factor through a simple regulating work.

To accomplish the object, the present invention proposes to automatically regulate currents supplied to operational amplifiers.

In accordance with the present invention, there is provided an active filter comprising: a filter circuit including a first operational amplifier responsive to an input signal under the control of a first controlling current, a second operational amplifier connected to the first operational amplifier for generating an output signal under the control of a second controlling current, and other circuit components for realizing a predetermined filtering characteristics together with the first and second operational amplifiers; and a current controlling circuit responsive to a frequency control signal representative of a target cut-off frequency and a quality factor control signal representative of a target quality factor so as to independently control a cut-off frequency of the filter circuit as a first function and a quality factor of the filter circuit as a second function.

BRIEF DESCRIPTION OF THE DRAWINGS

The features and advantages of the active filter according to the present invention will be more clearly understood from the following description taken in conjunction with the accompanying drawings in which.

DESCRIPTION OF THE PREFERRED EMBODIMENT

Figure 1:
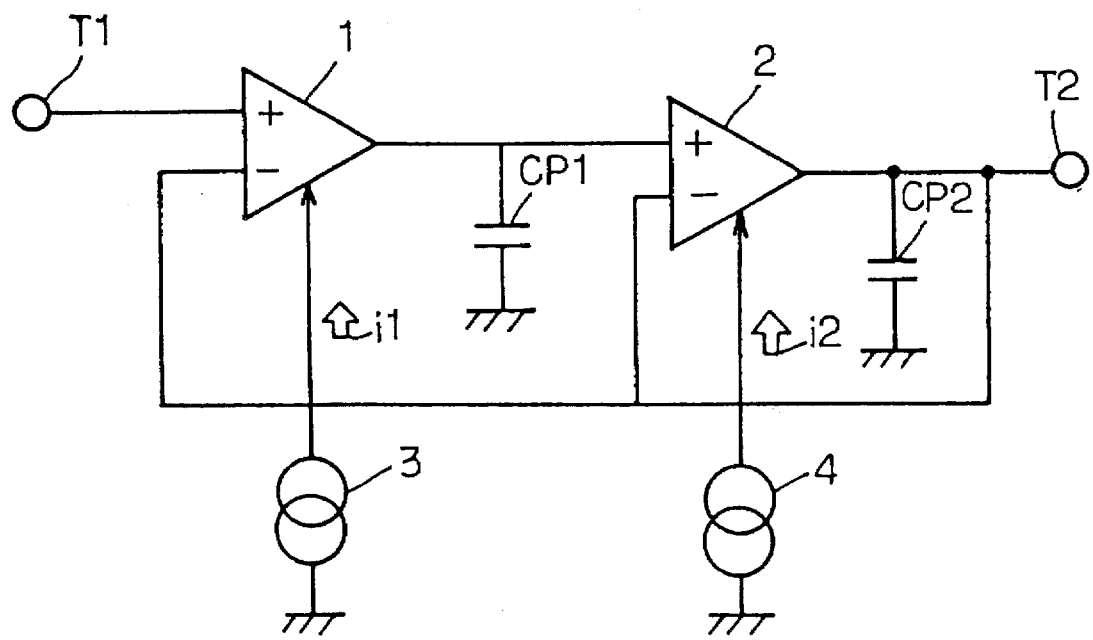
FIG. 1 is a circuit diagram showing the circuit configuration of the prior art active filter.
Figure 2:
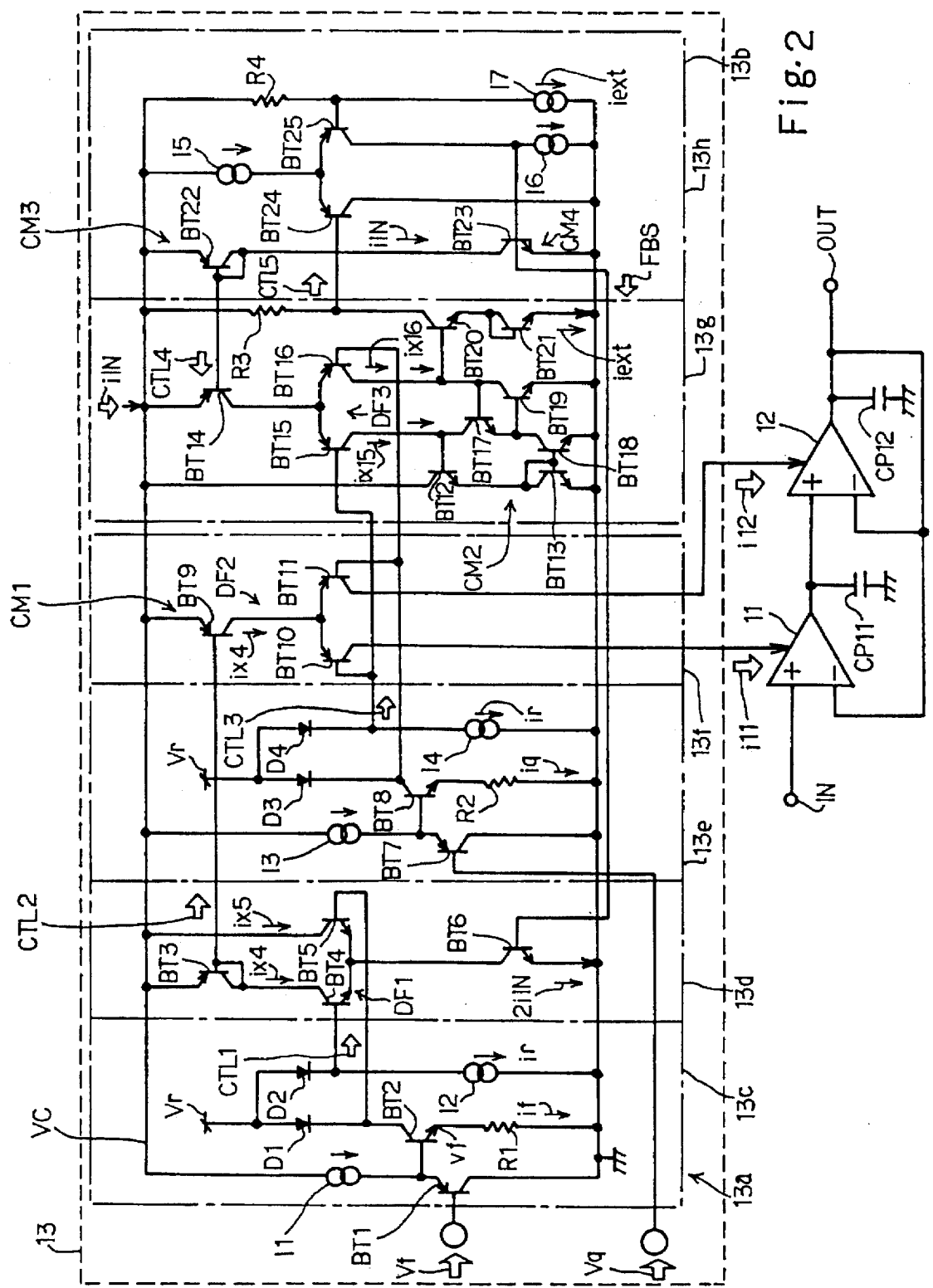
FIG. 2 is a circuit diagram showing the circuit configuration of an active filter according to the present invention.

Referring first to FIG. 2 of the drawings, an active filter embodying the present invention largely comprises a first operational amplifier 11, a second operational amplifier 12, two capacitors CP11 and CP12 respectively coupled to the output nodes of the operational amplifiers 11 and 12 and a current controlling circuit 13. Comparing FIG. 2 with FIG. 1, it is understood that the current sources 3 and 4 are replaced with the current controlling circuit 13, and the other circuit components 11, 12, CP11 and CP12 are corresponding to those of the prior art active filter. For this reason, description is focused on the current controlling circuit 13.

A current regulating circuit 13a and a corrective circuit 13b form in combination the current controlling circuit 13. A frequency control signal Vf is representative of a target cut-off frequency, and a quality factor control signal Vq is representative of a target quality factor.

The corrective circuit 13b is responsive to the quality factor control signal Vq for generating a feedback signal FBS, and the feedback signal FBS is representative of a corrective value for independently controlling the cut-off frequency and the quality factor through controlling currents i11 and i12. The corrective circuit 13b supplies the feedback signal FBS to the current regulating circuit 13a.

The current regulating circuit 13a is responsive to the frequency control signal Vf, the quality factor control signal Vq and the feedback signal FBS for regulating the controlling currents i11 and i12, and the controlling currents i11 and i12 are respectively supplied to the operational amplifiers 11 and 12 so as to independently control the cut-off frequency and the quality factor.

The current regulating circuit 13a includes a first input circuit 13c, a first multiplier 13d, a second input circuit 13e and a second multiplier 13e.

The frequency control signal Vf is supplied to the first input circuit 13c, and the first input circuit 13c generates a first internal control signal CTL1 representative of a frequency difference from a potential difference between the frequency control signal Vf and a reference signal Vr. The first multiplier 13d multiplies the first internal control signal CTL1 by the feedback signal so as to generate a second internal control signal CTL2 representative of the product.

The quality factor control signal Vq is supplied to the second input circuit 13e, and the second input circuit 13e generates a third internal control signal CTL3 representative of a difference in the quality factor from a potential difference between the quality factor control signal Vq and the reference signal Vr. The second multiplier 13f multiplies the product represented by the second internal control signal CTL2 by the difference represented by the third internal control signal CTL3 so as to generates the controlling currents i11 and i12.

On the other hand, the corrective circuit 13b includes a third multiplier 13g and a feedback circuit 13h. The third multiplier 13g multiplies the difference in the quality factor represented by the third internal control signal CTL3 by the output current of the feedback circuit 13h. The output current is represented by a fourth internal control signal CTL4. The feedback circuit 13h calculates a square root of the output of the third multiplier 13g represented by a fifth internal control signal CTL5, and generates the feedback signal representative of the square root.

The input circuit 13c includes a bipolar transistor BT1 and a current source I1. The bipolar transistor BT1 has a base node connected to the control terminal assigned to the frequency control signal Vf, an emitter node connected through the current source I1 to a power source line VC and a collector node connected to the ground. The input circuit 13c further includes a bipolar transistor BT2, a diode D1 and a resistor R1. The bipolar transistor BT2 has a base node connected to the emitter node of the bipolar transistor BT1, a collector node connected to the cathode of the diode D1 and an emitter node connected through the resistor R1 to the ground. The anode of the diode D1 is connected to the source of the reference signal Vr. The input circuit 13c further includes a diode D2 and a current source I2. The anode of the diode D2 is connected to the source of the reference signal Vr, and the cathode thereof is connected through the current source I2 to the ground.

The first multiplier 13d includes a bipolar transistor BT3, a parallel combination of bipolar transistors BT4 and BT5 and a bipolar transistor BT6. The bipolar transistor BT3 has an emitter node connected to the power source line VC, and the collector node and the base node thereof are connected to each other. The bipolar transistors BT4 and BT5 have respective collector nodes connected to the collector node of the bipolar transistor BT3 and the power source line VC, respectively, and the cathodes of the diodes D1 and D2 are respectively connected to the base nodes of the bipolar transistors BT4 and BT5. The emitter nodes of the bipolar transistors BT4 and BT5 are connected to the collector node of the bipolar transistor BT6. The feedback signal FBS is supplied to the base node of the bipolar transistor BT6, and the emitter node is grounded. The bipolar transistors BT4 and BT5 form in combination a differential circuit DF1.

The input circuit 13e includes a current source I3 and a bipolar transistor BT7. The emitter bipolar transistor BT7 has an emitter node connected through the current source I3 to the power voltage line VC, a base node connected to a control terminal assigned to the quality factor control signal Vq and a collector connected to the ground. The input circuit 13e further includes diodes D3 and D4, a bipolar transistor BT8, a resistor R2 and a current source I4. The anodes of the diodes D3 and D4 are connected to the source of the reference signal Vr, and the cathodes thereof are respectively connected to the collector node of the bipolar transistor BT8 and the current source I4. The base node of the bipolar transistor BT8 is connected to the emitter node of the bipolar transistor BT7, and the emitter node of the bipolar transistor BT8 is connected through the resistor R2 to the ground. The current source I4 discharges the current to the ground.

The second multiplier 13f includes a bipolar transistor BT9 and a parallel combination of bipolar transistors BT10 and BT11. The bipolar transistors BT10 and BT11 form in combination a second differential circuit DF2. The bipolar transistor BT9 has an emitter node connected to the power voltage line VC, a base node connected to the base node of the bipolar transistor BT3 and a collector node connected to the emitter nodes of the bipolar transistors BT10 and BT11. The cathodes of the diodes D3 and D4 are connected to the base nodes of the bipolar transistors BT10 and BT11, and the collector nodes of the bipolar transistors BT10 and BT11 are respectively connected to the operational amplifiers 11 and 12. The bipolar transistors BT3 and BT9 form a first current mirror circuit CM1.

The third multiplier 13g includes a series of bipolar transistors BT12 and BT13, a bipolar transistor BT14, a parallel combination of bipolar transistors BT15 and BT16, a series of bipolar transistors BT17 and BT18 and a bipolar transistor BT19. The bipolar transistors BT15 and BT16 form in combination a third differential circuit DF3. The series of bipolar transistors BT12 and BT13 is connected between the power voltage line VC and the ground, the base nodes of the bipolar transistors BT12 and BT13 are respectively connected to the collector nodes of the bipolar transistors BT15 and BT17 and the collector node of the bipolar transistor BT13. The bipolar transistor BT14 has an emitter node connected to the power voltage line VC and a base node connected to the feedback circuit 13h. The bipolar transistors BT15 and BT16 have emitter nodes commonly connected to the collector node of the bipolar transistor BT14, and the base nodes of the bipolar transistors BT15 ad BT16 are respectively connected to the cathodes of the diodes D3 and D4. The collector node of the bipolar transistor BT15 is connected through the series of bipolar transistors BT17 and BT18 to the ground, and the collector node of the bipolar transistor BT16 is connected through the bipolar transistor BT19 to the ground. The base node of the bipolar transistor BT17 is connected to the collector node of the bipolar transistor BT19, and the base node of the bipolar transistor BT18 is connected to the base node and the collector node of the bipolar transistor BT13. The base node of the bipolar transistor BT19 is connected to the collector node of the bipolar transistor BT18. The bipolar transistors BT13 and BT18 form in combination a second current mirror circuit CM2. The third multiplier 13g further includes a series of a resistor R3 and bipolar transistors BT20 and BT21 coupled between the power voltage line VC and the ground. The base node of the bipolar transistor BT20 is connected to the collector node of the bipolar transistor BT16, and the base node of the bipolar transistor BT21 is connected to the collector node thereof.

The feedback circuit 13h includes a series combination of a bipolar transistors BT22 and BT23 connected between the power voltage line VC and the ground, a current source I5, a parallel combination of bipolar transistors BT24 and BT25, a current source I6 and a series combination of a resistor R4 and a current source I7 coupled between the power voltage line VC and the ground. The bipolar transistor has an emitter node connected to the power voltage line VC and a collector node connected to the base node thereof and the base node of the bipolar transistor BT14, and the bipolar transistors BT14 and BT22 form in combination a third current mirror circuit CM3. The parallel combination of bipolar transistors BT24 and BT25 have respective emitter nodes commonly connected through the current source I5 to the power voltage line VC. The base node of the bipolar transistor BT24 is connected to the collector node of the bipolar transistor BT20, and the collector node thereof is grounded. The base node of the bipolar transistors BT25 is connected to the resistor R4, and the collector node thereof is connected through the current source I6 to the ground. The current source I7 allows current iext to flow therethrough. The bipolar transistors BT23 and BT6 form in combination a fourth current mirror circuit CM4. In this instance, the emitter region of the bipolar transistor BT6 is twice as wide as the emitter region of the bipolar transistor BT23, and the collector current of the bipolar transistor BT6 is twice as much as the collector current of the bipolar transistor BT23. The resistor R3 is equal in resistance to the resistor R4.

The active filter according to the present invention behaves as follows. Assuming now that the frequency control signal Vf changes the target cut-off frequency, the bipolar transistor BT1 changes the emitter current thereof and, accordingly, the base potential of the bipolar transistor BT2, and the bipolar transistor BT2 changes the emitter potential vf. The resistor R1 changes the current if passing therethrough, and the current if is corresponding to the variation of the target cut-off frequency represented by the frequency control signal Vf.

Reference current ir flows through the current source I2, and the diodes D1 and D2 generates the first internal control signal CTL1 representative of the potential difference between the frequency control signal Vf and the reference signal Vr. The first internal control signal CTL1 is supplied to the base nodes of the bipolar transistors BT4 and BT5.

The first multiplier 13d generates the product through a variable conductance method well known to a person skilled in the art. According to the variable conductance method, transistors of a differential circuit change the conductances in dependence on the emitter current so as to calculate a product. As described hereinbefore, the emitter nodes of the bipolar transistors BT4 and BT5 are commonly connected to the collector of the bipolar transistor BT6, and the bipolar transistor BT6 causes the collector current to flow twice as much as the collector current of the bipolar transistor BT23. The collector current of the bipolar transistor BT6 controls the conductances of the bipolar transistors BT4 and BT5, and the potential difference represented by the first internal control signal CTL1 is multiplied by the potential level of the feedback signal FBS. The product is expressed by the collector current passing through the bipolar transistor BT3 and BT4, and is supplied to the base node of the bipolar transistor BT9 as the second internal control signal CTL2. The value of the second internal control signal CTL2 serves as a multiplicand in the second multiplier 13f.

On the other and, the second input circuit 13e behaves as similar to the first input circuit 13c. The bipolar transistors BT7 and BT8 generate emitter current iq corresponding to a variation of the target quality factor represented by the quality factor control signal Vq. The diodes D3 and D4 generates the third internal control signal CTL3 representative of the difference between the emitter current ig and the reference current ir. The third internal control signal CTL3 is supplied to the second and third multipliers 13f and 13g.

The second multiplier 13f multiplies the potential difference represented by the third internal control signal CTL3 by the base potential represented by the second internal control signal CTL2. The collector nodes of the bipolar transistors BT10 and BT11 are respectively connected to the operational amplifiers 11 and 12, and supply the controlling current i11 and i12.

The third differential circuit DF3 behaves as similar to the first multiplier 13d. The bipolar transistor BT14 supplies current iIN to the bipolar transistors BT15 and BT16, and the amount of current iIN is controlled by the fourth internal control signal CTL4. Therefore, the potential level at the base node of the bipolar transistor BT14 serves as a multiplicand in the third multiplier 13g.

The current iIN is split into collector currents i×15 and i×16. The resistors R3/R4 equal in resistance and the bipolar transistors BT24/BT25 equally regulate the currents passing through the resistors R3 and R4, and the emitter current of the bipolar transistor BT21 is equal to the current iext. In this situation, we have $$Vbe17 + Vbe19 = Vbe20 + Vbe21 \quad (14)$$

$$VT\ln(ix15/Is) + VT\ln(ix16/Is) = 2VT\ln(iext/Is) \quad (15)$$

where $Vbe^{}$ is the emitter-base voltage of the bipolar transistor $BT^{}$, VT is KT/q, Is is the saturated current of the bipolar transistor, K is Bolzmann constant, T is absolute temperature and q is the magnitude of electronic charge. We obtain equation 16.

$$VT\ln(ix15 \cdot ix16/iext^2) = 0 \quad (16)$$

Therefore $$iext = (ix15 \cdot ix16)^{1/2} \quad (17)$$

Thus, the bipolar transistor BT21 calculates the square root.

The collector currents i15 and i16 are controlled by the quality factor control signal Vq through the second input circuit 13e. When the quality factor control signal Vq is changed by $\Delta Vq$, the collector currents i15 and i16 are expressed by equations 18 and 19.

$$ix15 = iIN(1-\Delta Q)/2 \quad (18)$$

$$ix16 = iIN(1+\Delta Q)/2 \quad (19)$$

where $\Delta Q$ is approximated to $I_{IN}(\Delta - Vq/R2)/(ir+iq)$.

We substitute equations 18 and 19 for equation 17. The current iIN is expressed by equation 20.

$$iIN = 2iext/\{(1+\Delta Q)(1-\Delta Q)\}^{1/2} \quad (20)$$

The current mirror circuit CM4 increases the current passing through the bipolar transistor BT6 twice as large as the current iIN.

Assuming now that the frequency control signal Vf is changed by $\Delta Vf$, the emitter current of the bipolar transistor BT6 is given by equation 21.

$$2iIN = 4iext/\{(1+\Delta Q)(1-\Delta Q)\}^{1/2} \quad (21)$$

Therefore, the collector currents of the bipolar transistors BT4 and BT5 are expressed as follows.

$$ix4 = 2\,iext(1+\Delta f)/\{(1+\Delta Q)(1-\Delta Q)\}^{1/2} \quad (22)$$

$$ix5 = 2\,iext(1+\Delta f)/\{(1+\Delta Q)(1-\Delta Q)\}^{1/2} \quad (23)$$

where $\Delta f$ is approximated to $2\,iIN(\Delta Vf/R1)/(ir+if)$, and ir is the current passing through the current source I2.

The collector current ix4 is equal to the collector current of the bipolar transistor BT9, and the controlling currents i11 and i12 are given as follows.

$$i11 = iext(1+\Delta f)\{(1-\Delta Q)/(1+\Delta Q)\}^{1/2} \quad (24)$$

$$i12 = iext(1-\Delta f)\{(1+\Delta Q)/(1-\Delta Q)\}^{1/2} \quad (25)$$

Subsequently, when the operational amplifiers 11 and 12 are controlled by the controlling currents i11 and i12, the cut-off frequency fo and the quality factor Q is calculated as follows.

When the $\Delta f$ and $\Delta Q$ are zero, the mutual conductances gm1c and gm2c of the operational amplifiers 11 and 12 are given by equations 26 and 27.

$$gm1c = ix11\,X1 = iEXT\,X1 \quad (26)$$

$$gm2c = ix12\,X2 = iEXT\,X2 \quad (27)$$

therefore, the cut-off frequency foc and the quality factor Qc are expressed by equations 28 and 29.

$$foc = \tfrac{1}{2}pi(gm1c\,gm2c/C11C12)^{1/2} \quad (28)$$

$$Qc = \{(C12gm1c)/(C11gm2c)\}^{1/2} \quad (29)$$

where c11 and c12 are capacitances of the capacitors C11 and C12.

When the control signals Vr and Vq are changed, the mutual conductances gm1a and gm2a of the operational amplifiers 11 and 12 are expressed as follows.

$$\begin{aligned}gm1a &= i11\,X1 \quad (30)\\ &= gm1c(1+\text{delta-}f)\{(1-\Delta Q)/(1+\Delta Q)\}^{1/2}\end{aligned}$$

$$\begin{aligned}gm2a &= i12\,X2 \quad (31)\\ &= gm2c(1-\Delta f)\{(1+\Delta Q)/(1-\Delta Q)\}^{1/2}\end{aligned}$$

The cut-off frequency foa and the quality factor Qa are given by equations 32 and 33.

$$foa = foc(1+\Delta f) \quad (32)$$

$$Qa = Qc\{(-\Delta Q)/(1=\Delta Q)\}^{1/2} \quad (33)$$

As will be understood from equations 32 and 33, when the frequency control signal Vf and the quality factor control signal Vq are varied by $\Delta Vf$ ad $\Delta Vq$, $\Delta f$ and $\Delta Q$ are changed, and $\Delta f$ and $\Delta Q$ independently change the cut-off frequency fo and the quality factor Q.

Figure 3A:
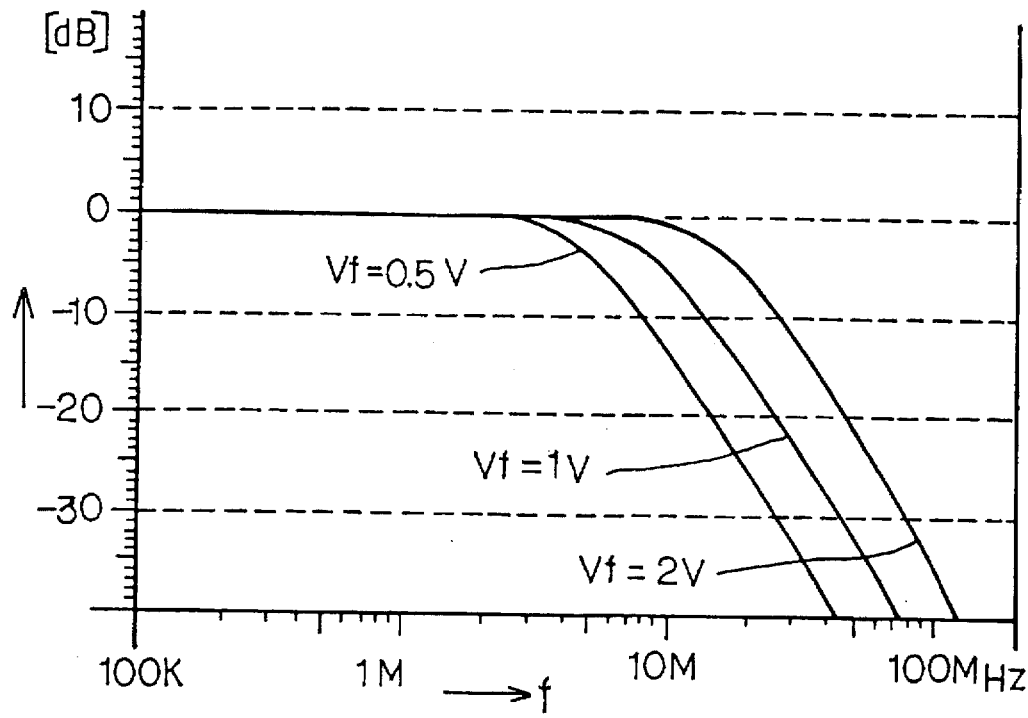
FIGS. 3A to 3D are graphs showing frequency characteristics of the active filter.
Figure 3B:
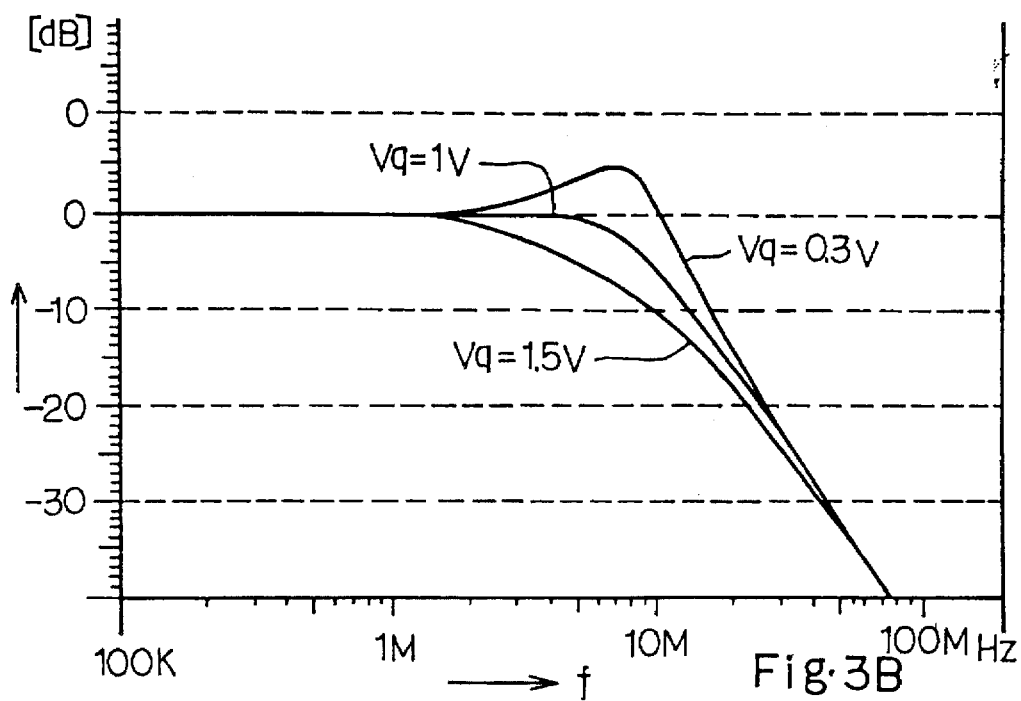
Figure 3C:
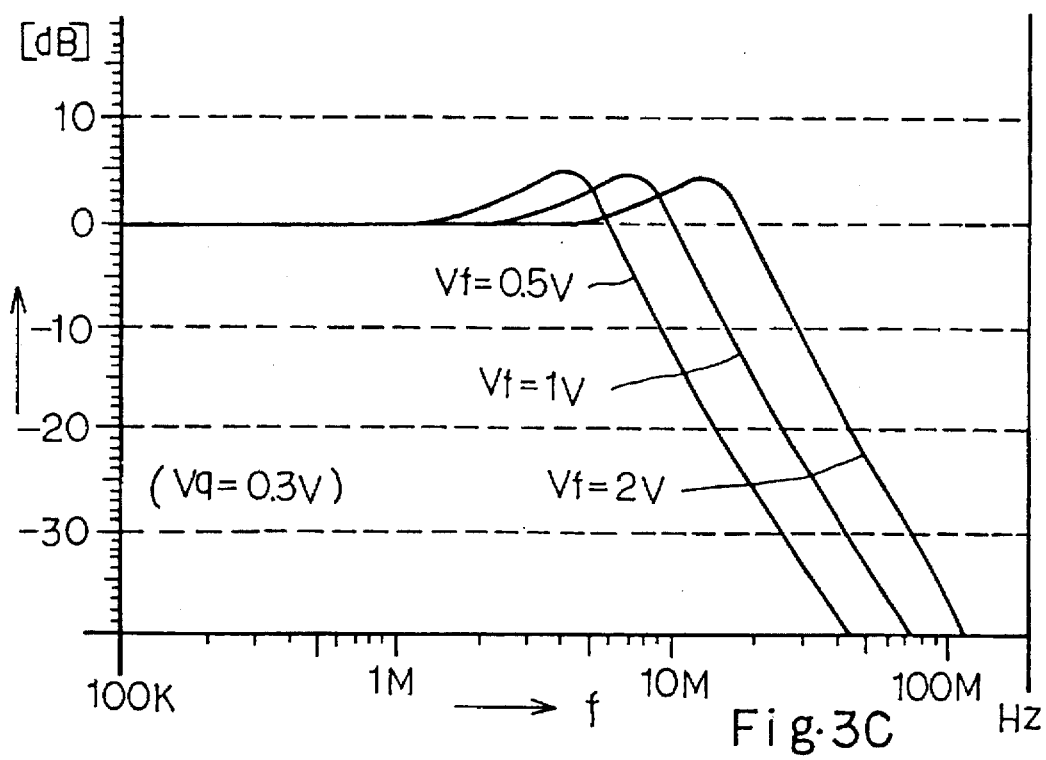
Figure 3D:
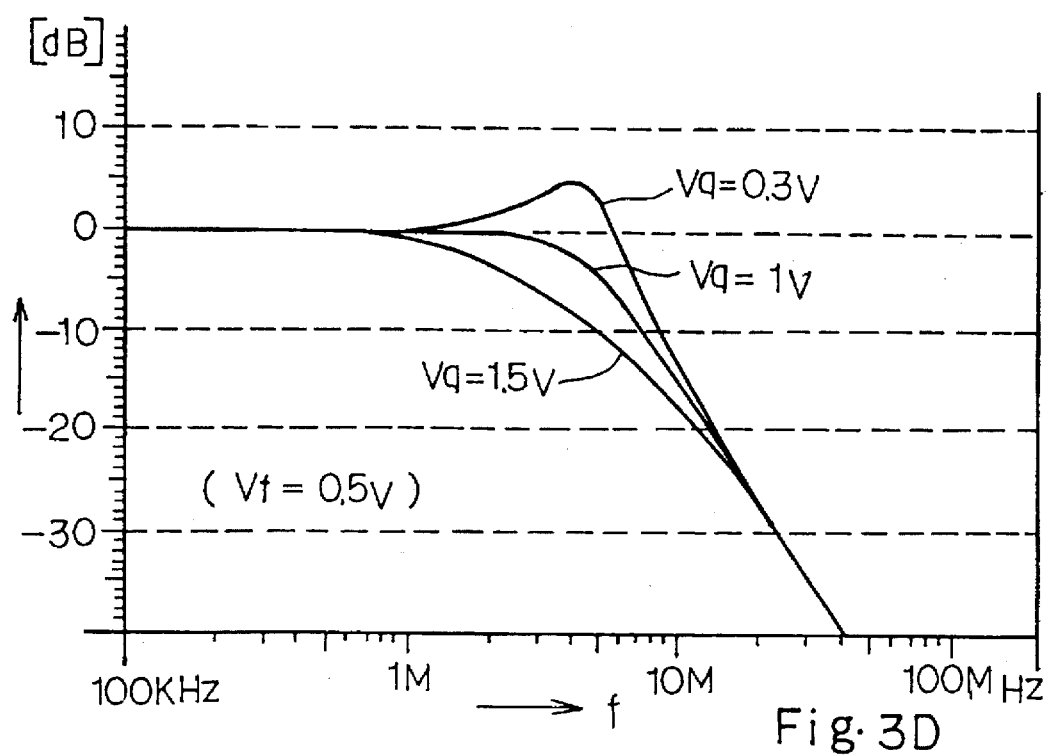

FIGS. 3A to 3D shows frequency characteristics of the active filter according to the present invention. When the frequency control signal Vf was changed to 0.5 volt, 1 volt and 2 volts, the cut-off frequency fo was varied as shown in FIG. 3A. When the quality control signal Vq was changed to 0.3 volt, 1 volt and 1.5 volts, the active filter changed the frequency characteristics around the cut-off frequency fo as shown in FIG. 3B. When the frequency control signal Vf was changed to 0.5 volt, 1 volt and 2 volts under the quality factor control signal at 0.3 volt, the active filter changed the cut-off frequency fo as shown in FIG. 3C. Finally, when the quality factor control signal Vq was changed to 0.3 volt, 1 volt and 1.5 volts under the frequency control signal Vf at 0.5 volt, the active filter changed the frequency characteristics around the cut-off frequency as shown in FIG. 3D.

As will be understood from FIGS. 3A to 3D, the frequency control signal Vf and the quality factor control signal Vq independently controls the active filter. The current controlling circuit 13 automatically regulates the controlling currents i11 and i12, in such a manner that the cut-off frequency fo and the quality factor Q are independently controlled.

Although particular embodiments of the present invention have been shown and described, it will be obvious to those skilled in the art that various changes and modifications may be made without departing from the spirit and scope of the present invention.

For example, the present invention is applicable to nth-order low-pass filter, a band-pass filter and a high-pass filter so as to independently control the cut-off frequency and the quality factor.

Another circuit configuration may be available for the calculation of the square root.

What is claimed is:

1. An active filter comprising:

a filter circuit including a first operational amplifier responsive to an input signal under the control of a first controlling current, a second operational amplifier connected to said first operational amplifier for generating an output signal under the control of a second controlling current, and means for realizing a predetermined filtering characteristic connected to said first and second operational amplifiers; and a current controlling circuit connected to said filter circuit and being responsive to a frequency control signal representative of a target cut-off frequency and a quality factor control signal representative of a target quality factor, wherein said current controlling circuit independently controls a cut-off frequency of said output signal and a quality factor of said output signal said current controlling circuit comprising:
  a first input circuit supplied with said frequency control signal and generating a first control signal representative of a difference between said frequency control signal and a first signal;
  a first multiplier supplied with said first control signal and a feedback signal and multiplying said first control signal by said feedback signal for generating a second control signal;
  a second input circuit supplied with said quality factor control signals and generating a third control signal representative of a difference between said quality factor control signal and said first signal;
  a second multiplier supplied with said second and third control signals and multiplying said second control signal by said third control signal for generating said first and second controlling currents;
  a third multiplier supplied with said third control signal and a fourth control signal and multiplying said third control signal and said fourth control signal for generating a fifth control signal; and
  a feedback circuit for calculating a square root of said fifth control signal and for generating said feedback signal and said fourth control signal.

2. The active filter as set forth in claim 1, wherein said active filter comprises a first function and a second function, and said first function and said second function are expressed as:

$$foa = foc(1+\Delta f); \text{ and}$$

$$Qa = Qc\{(1-\Delta Q)/(1+\Delta Q)\}^{1/2};$$

wherein foa is said target cut-off frequency, foc is said cut-off frequency at a reference value of said frequency control signal, $\Delta f$ is a product of a first value and a difference between said frequency control signal representative of said target cut-off frequency and said frequency control signal representative of said reference value, Qa is said target quality factor, Qc is said quality factor at a reference value of said quality factor control signal, $\Delta Q$ is a product of a second value and a difference between said quality factor control signal representative of said target cut-off frequency and said quality factor control signal representative of said reference value.

* * * * *